(12) United States Patent
Nagashima

(10) Patent No.: US 12,016,184 B2
(45) Date of Patent: Jun. 18, 2024

(54) SEMICONDUCTOR MEMORY DEVICE

(71) Applicant: KIOXIA CORPORATION, Tokyo (JP)

(72) Inventor: Hidenobu Nagashima, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 18/348,826

(22) Filed: Jul. 7, 2023

(65) Prior Publication Data

US 2023/0354612 A1  Nov. 2, 2023

Related U.S. Application Data

(63) Continuation of application No. 18/148,924, filed on Dec. 30, 2022, now Pat. No. 11,871,578, which is a
(Continued)

(30) Foreign Application Priority Data

Mar. 20, 2018 (JP) ................. 2018-052449

(51) Int. Cl.
*H10B 43/50* (2023.01)
*H01L 21/762* (2006.01)
(Continued)

(52) U.S. Cl.
CPC ....... *H10B 43/50* (2023.02); *H01L 21/76224* (2013.01); *H01L 21/76805* (2013.01);
(Continued)

(58) Field of Classification Search
CPC ........ H10B 43/50; H10B 43/10; H10B 43/27; H10B 43/40; H10B 43/35; H10B 69/00;
(Continued)

(56) References Cited

U.S. PATENT DOCUMENTS 9,431,419 B2  8/2016  Fukuzumi
9,646,975 B2  5/2017  Peri et al.
(Continued)

FOREIGN PATENT DOCUMENTS

CN  105633089 A  6/2016
CN  106449595 A  2/2017
JP  2017-103328  6/2017

*Primary Examiner* — Yasser A Abdelaziez
(74) *Attorney, Agent, or Firm* — Oblon, McClelland, Maier & Neustadt, L.L.P.

(57) ABSTRACT

According to one embodiment, a semiconductor memory device includes a stacked body, memory pillars, first and second insulation layers and an isolation region. The stacked body above a substrate includes conductive layers isolated from each other and stacked along a first direction crossing the substrate surface. The memory pillars extend through the stacked body along the first direction. The first insulation layer is provided above the memory pillars. The isolation region is provided higher than upper surfaces of the memory pillars in the stacked body along the first direction, and isolates the stacked body in a second direction crossing the first direction. The second insulation layer is provided on the first insulation layer and a side wall of the isolation region.

20 Claims, 16 Drawing Sheets

Related U.S. Application Data continuation of application No. 17/184,094, filed on Feb. 24, 2021, now Pat. No. 11,610,912, which is a continuation of application No. 16/834,472, filed on Mar. 30, 2020, now Pat. No. 10,971,512, which is a continuation of application No. 16/124,553, filed on Sep. 7, 2018, now Pat. No. 10,651,190.

(51) Int. Cl.
| | | |
|---|---|---|
| *H01L 21/768* | (2006.01) | |
| *H01L 23/535* | (2006.01) | |
| *H10B 43/10* | (2023.01) | |
| *H10B 43/27* | (2023.01) | |
| *H10B 43/40* | (2023.01) | |
| *H01L 21/311* | (2006.01) | |

(52) U.S. Cl.
CPC ........... *H01L 23/535* (2013.01); *H10B 43/10* (2023.02); *H10B 43/27* (2023.02); *H10B 43/40* (2023.02); *H01L 21/31111* (2013.01); *H01L 21/31116* (2013.01)

(58) Field of Classification Search
CPC ......... H01L 21/76224; H01L 21/76805; H01L 23/535; H01L 21/31111; H01L 21/31116
See application file for complete search history.

(56) References Cited

U.S. PATENT DOCUMENTS

| | | |
|---|---|---|
| 9,653,475 B1 | 5/2017 | Yoshimizu et al. |
| 10,777,501 B2 * | 9/2020 | Nakajima ............... H10B 43/40 |
| 11,069,701 B2 * | 7/2021 | Noda ..................... H10B 43/10 |
| 2009/0184389 A1 | 7/2009 | Bertin |
| 2015/0129878 A1 | 5/2015 | Shin |
| 2017/0077137 A1 | 3/2017 | Kim |
| 2017/0179154 A1 | 6/2017 | Furihata |
| 2017/0200736 A1 | 7/2017 | Park et al. |
| 2017/0243884 A1 | 8/2017 | Nakaki et al. |
| 2018/0006049 A1 | 1/2018 | Inomata |
| 2018/0076293 A1 | 3/2018 | Nishimura |
| 2018/0226341 A1 | 8/2018 | Yazawa |
| 2019/0067314 A1 | 2/2019 | Lu |
| 2019/0172794 A1 | 6/2019 | Ito |
| 2019/0229125 A1 | 7/2019 | Zhou |
| 2019/0280000 A1 | 9/2019 | Nakamura |

* cited by examiner

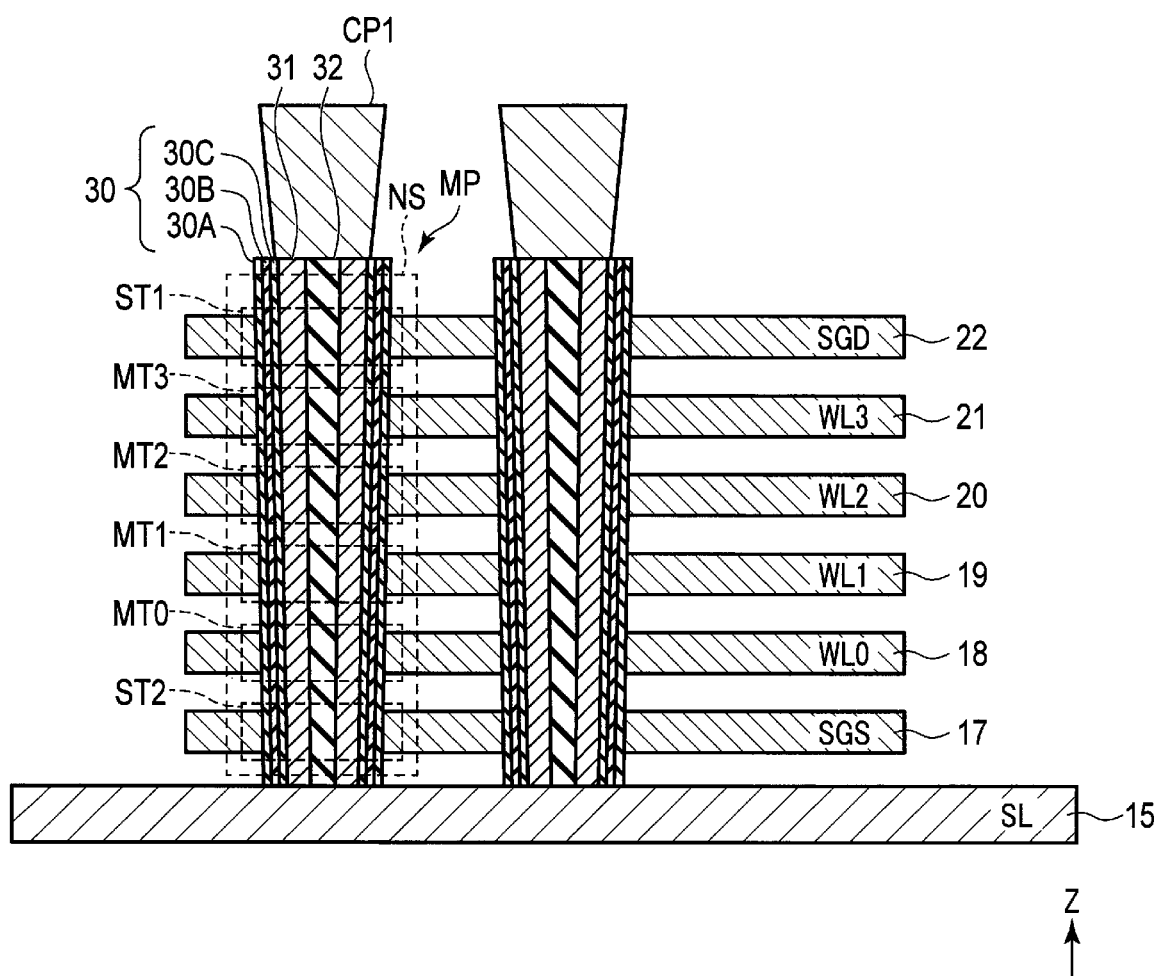
F I G. 4

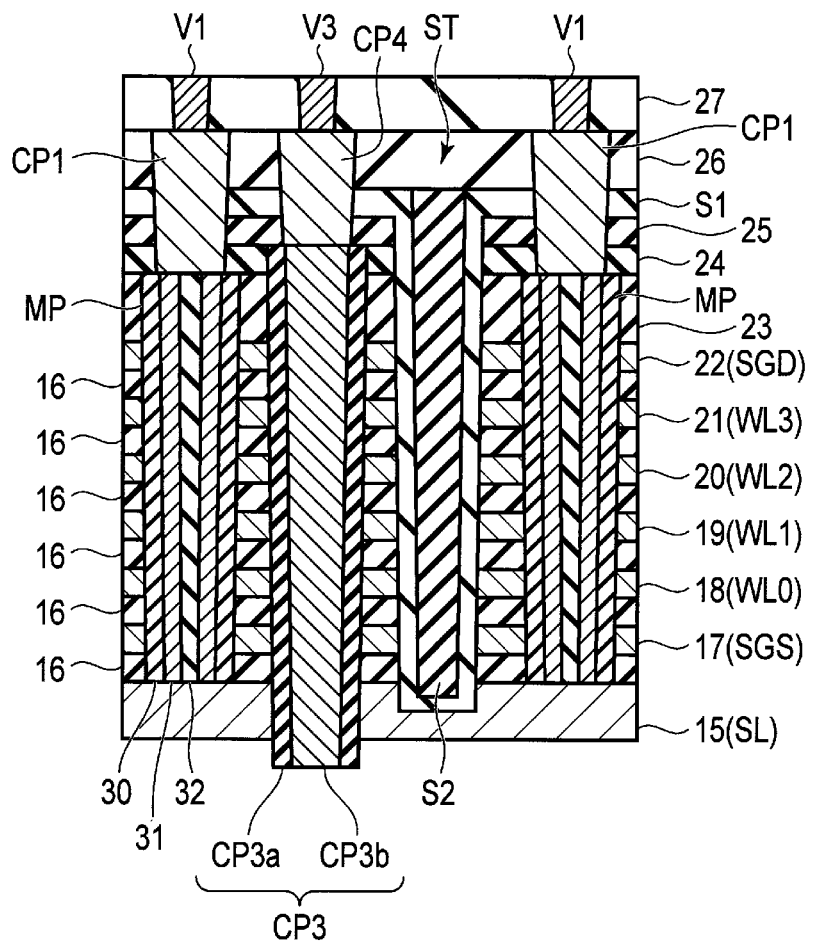
F I G. 5

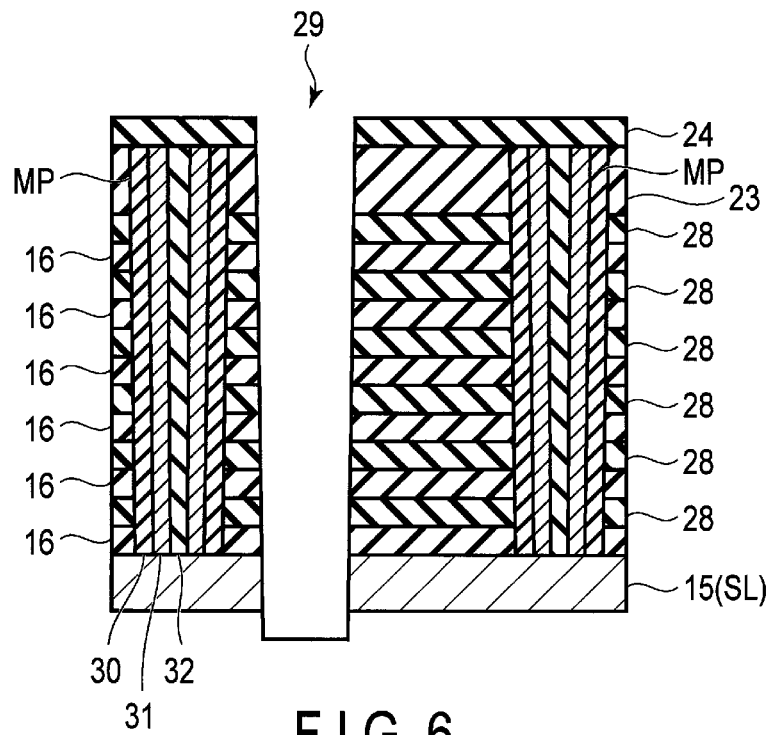
F I G. 6
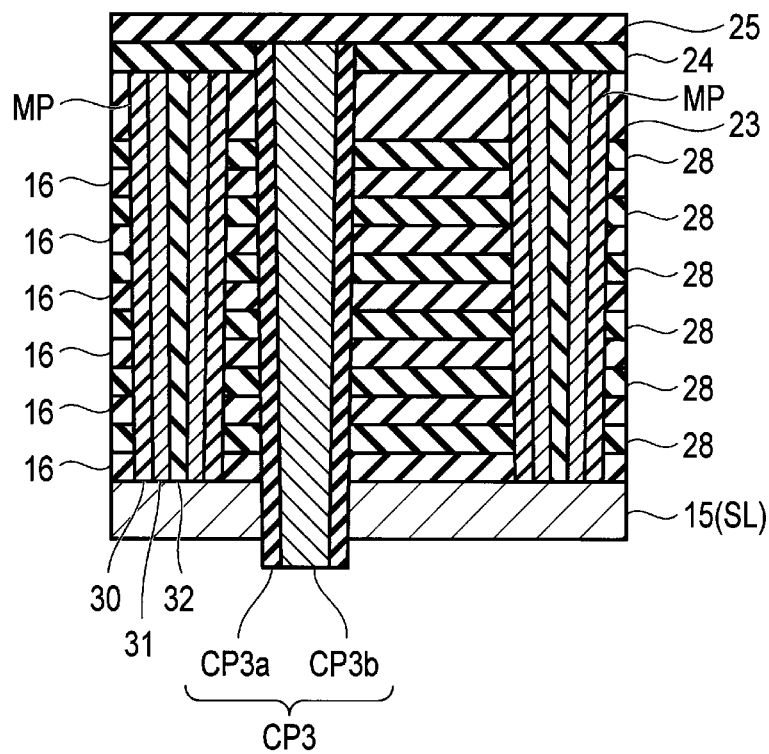
F I G. 7

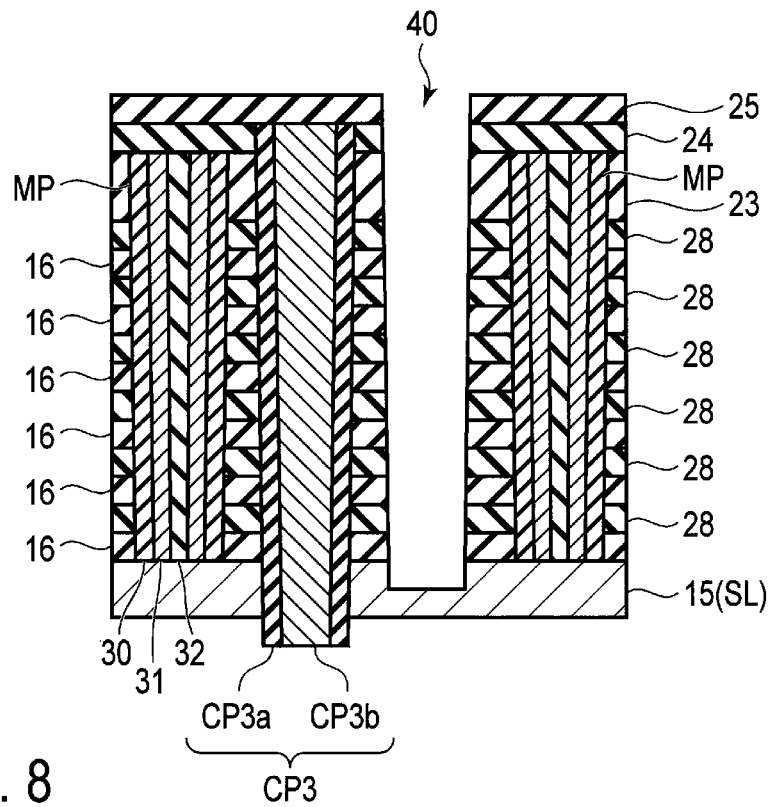
F I G. 8
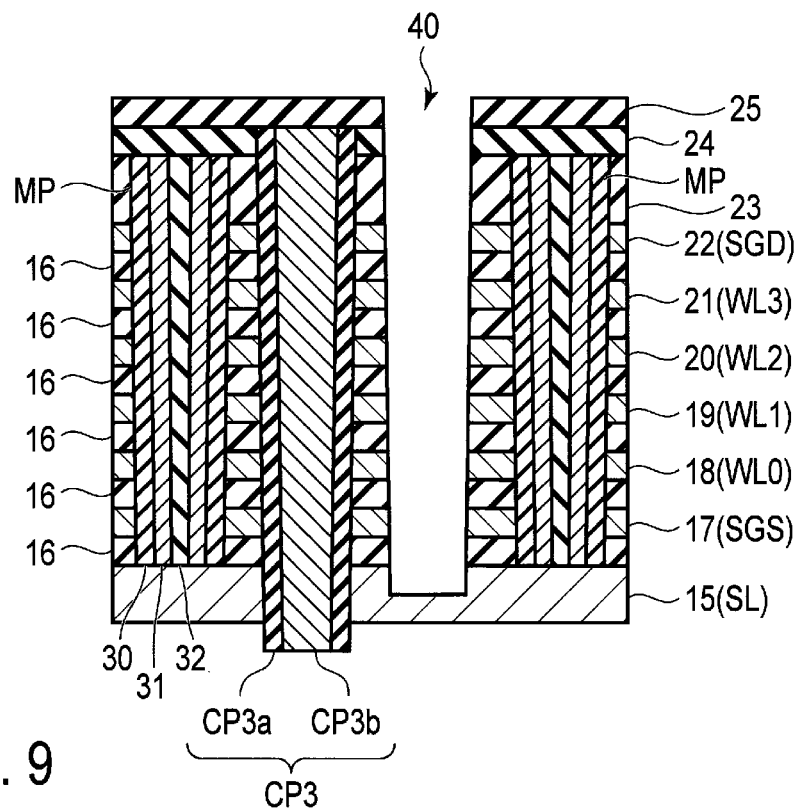
F I G. 9

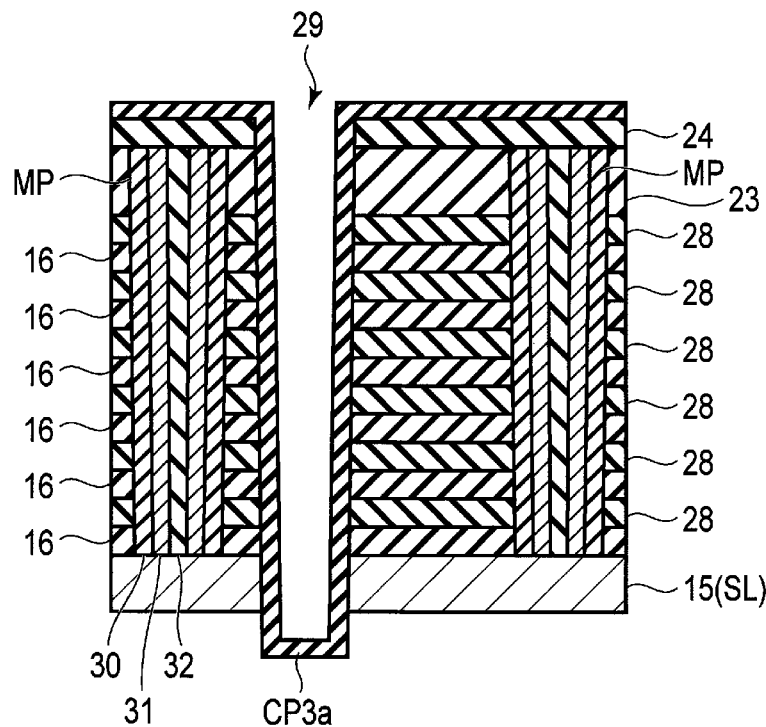
F I G. 16
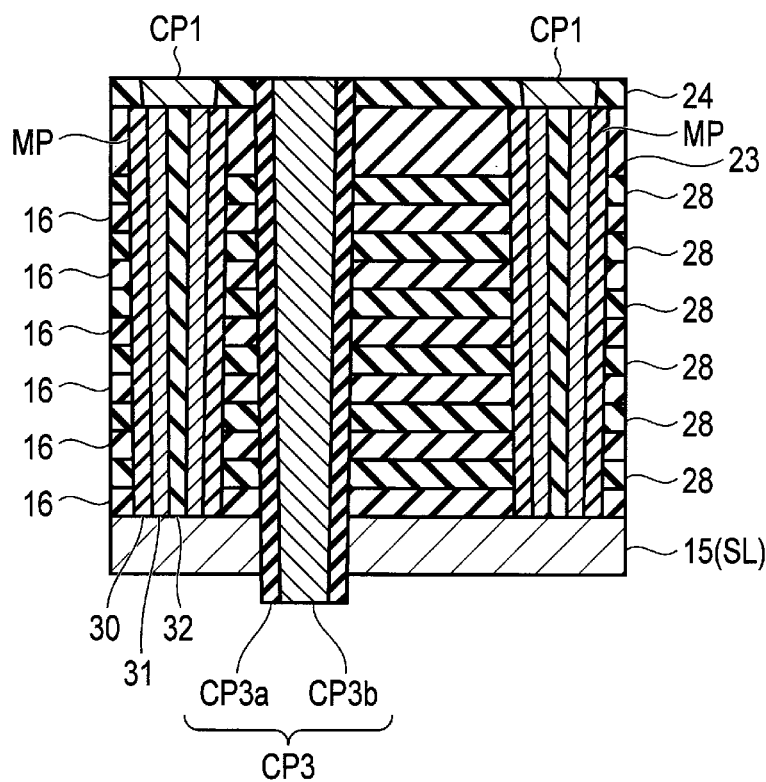
F I G. 17

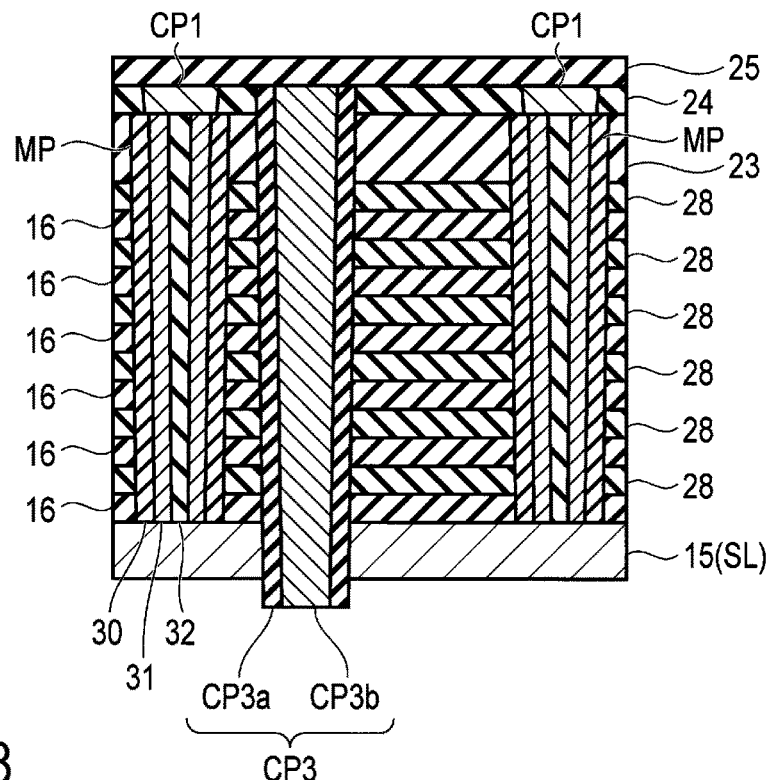
F I G. 18
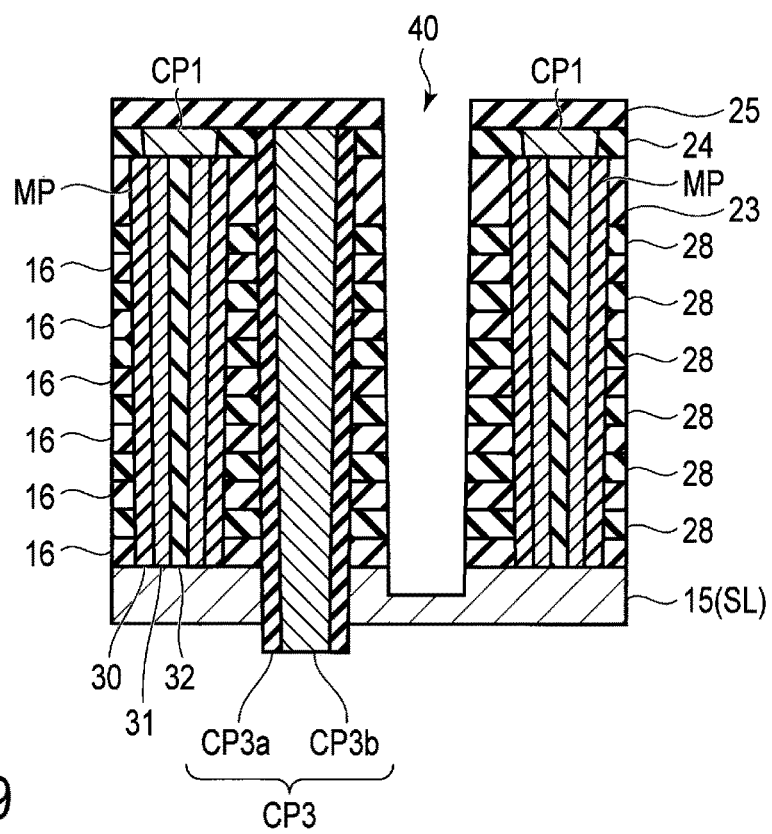
F I G. 19

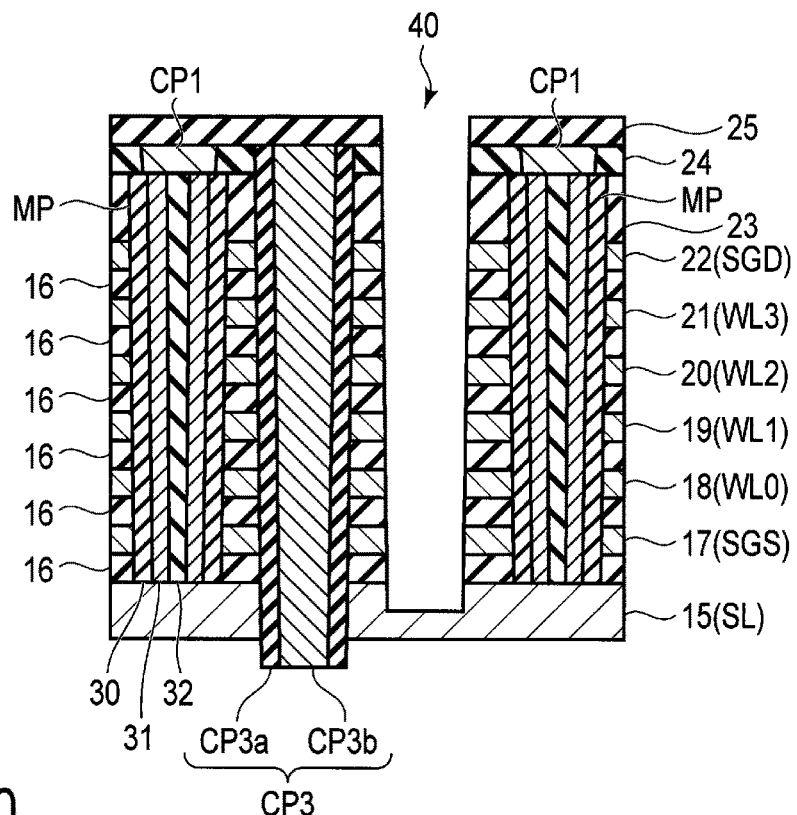
F I G. 20
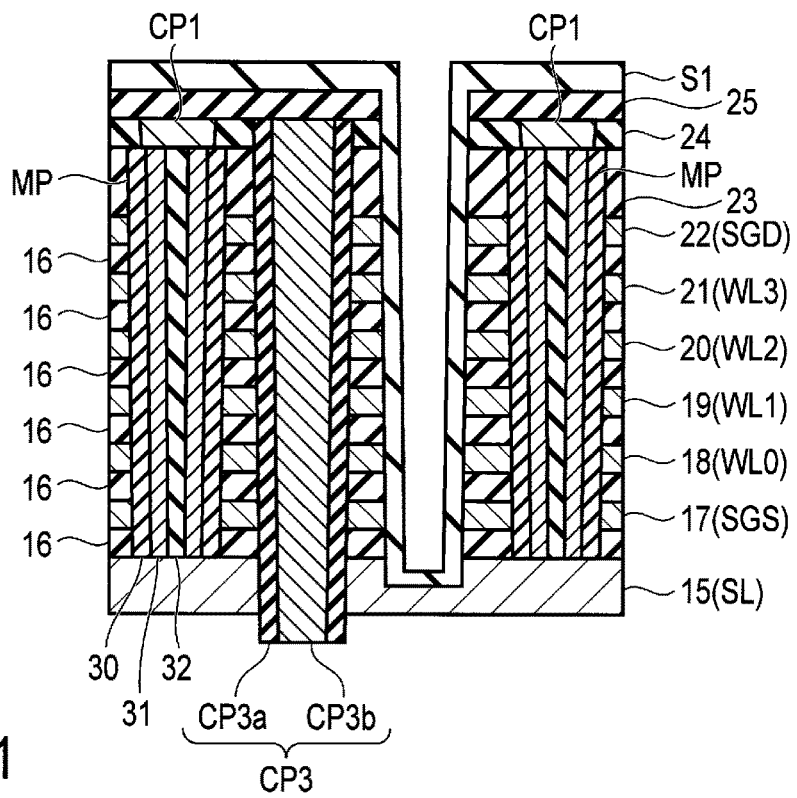
F I G. 21

SEMICONDUCTOR MEMORY DEVICE

CROSS-REFERENCE TO RELATED APPLICATIONS

This application is a continuation of and claims benefit under 35 U.S.C. § 120 to U.S. application Ser. No. 18/148,924, filed Dec. 30, 2022, which is a continuation of and claims benefit under 35 U.S.C. § 120 to U.S. application Ser. No. 17/184,094, filed Feb. 24, 2021, which is a continuation of and claims benefit under 35 U.S.C. § 120 to U.S. application Ser. No. 16/834,472, filed Mar. 30, 2020, which is a continuation of and claims benefit under 35 U.S.C. § 120 to U.S. application Ser. No. 16/124,553, filed Sep. 7, 2018, which is based upon and claims the benefit of priority under 35 U.S.C. § 119 to Japanese Patent Application No. 2018-052449, filed Mar. 20, 2018, the entire contents of each of which are incorporated herein by reference.

FIELD

Embodiments described herein relate generally to a semiconductor memory device.

BACKGROUND

A NAND flash memory, in which memory cells are three-dimensionally arranged, has been known as a semiconductor memory device.

BRIEF DESCRIPTION OF THE DRAWING

FIG. 4 is a cross section of a memory cell array of the semiconductor memory device according to a first embodiment, taken along the Y direction.

FIG. 5 is a cross section of the main portion of the structure according to the first embodiment.

FIGS. 6 to 12 are cross sections of the structure, which represent processes of a method for manufacturing the semiconductor memory device according to the first embodiment.

FIGS. 16 to 22 are cross sections of the structure, which represent processes of a method for manufacturing the semiconductor memory device according to the second embodiment.

DETAILED DESCRIPTION

Figure 1:
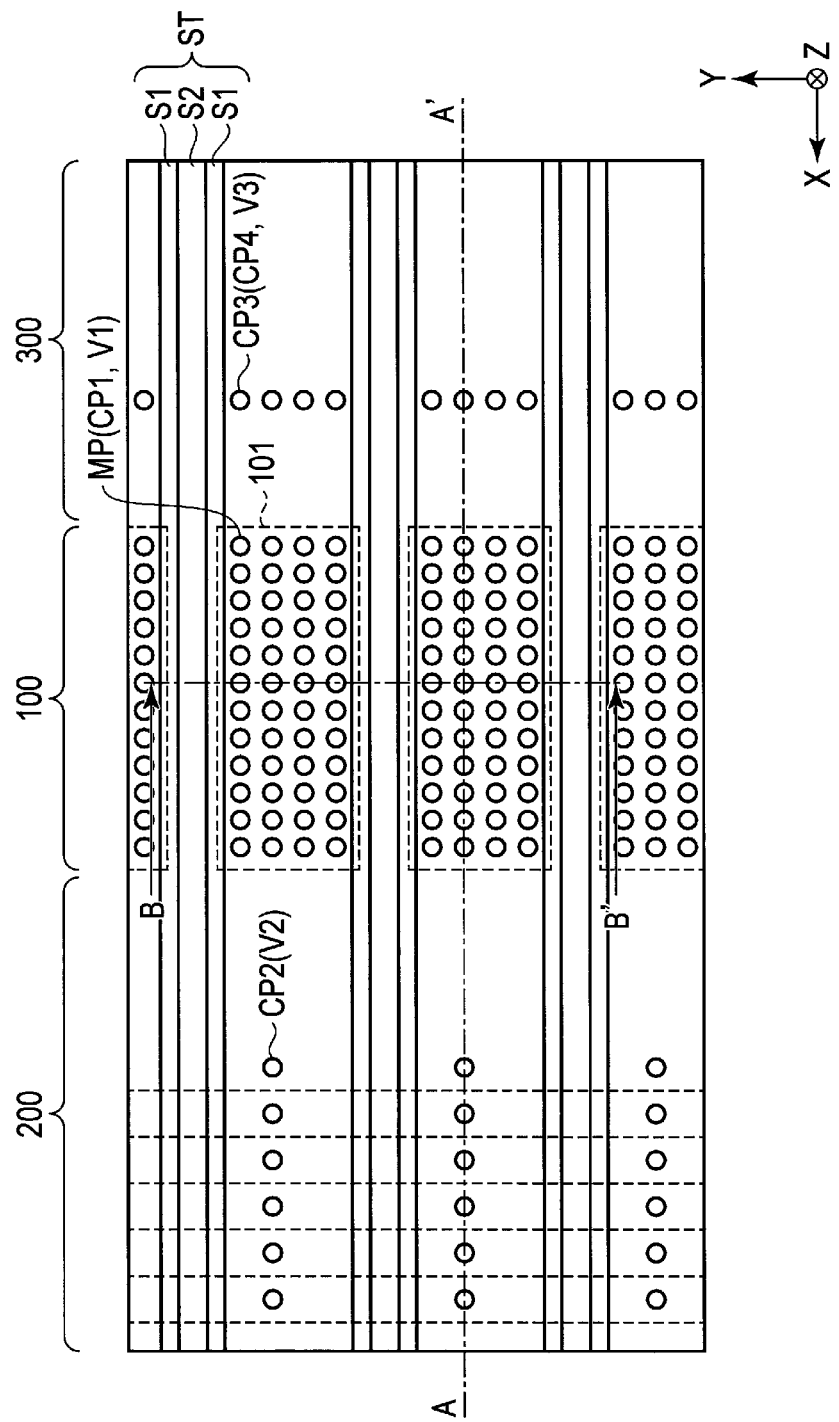
FIG. 1 is a plan view showing a structure of a semiconductor memory device according to embodiments.

In general, according to one embodiment, a semiconductor memory device comprises: a stacked body provided above a substrate, in which conductive layers are isolated from each other and stacked along a first direction crossing a surface of the substrate; memory pillars that extend through the stacked body along the first direction; a first insulation layer provided above the memory pillars; an isolation region provided higher than upper surfaces of the memory pillars in the stacked body along the first direction, the isolation region isolating the stacked body in a second direction crossing the first direction; and a second insulation layer provided on the first insulation layer and a side wall of the isolation region.

The embodiments will be explained with reference to the drawings. In the following explanation, components having the same functions and structures will be referred to by the same reference numerals. The embodiments are described to give examples of apparatuses and methods that realize the technical concepts of the embodiments.

[1] First Embodiment

The semiconductor memory device according to a first embodiment will be discussed. Here, as an example of a semiconductor memory device, a three-dimensionally stacked NAND flash memory in which memory cell transistors (hereinafter also referred to as memory cells) are stacked above the semiconductor substrate will be considered.

[1-1] Structure of Semiconductor Memory Device

Figure 2:
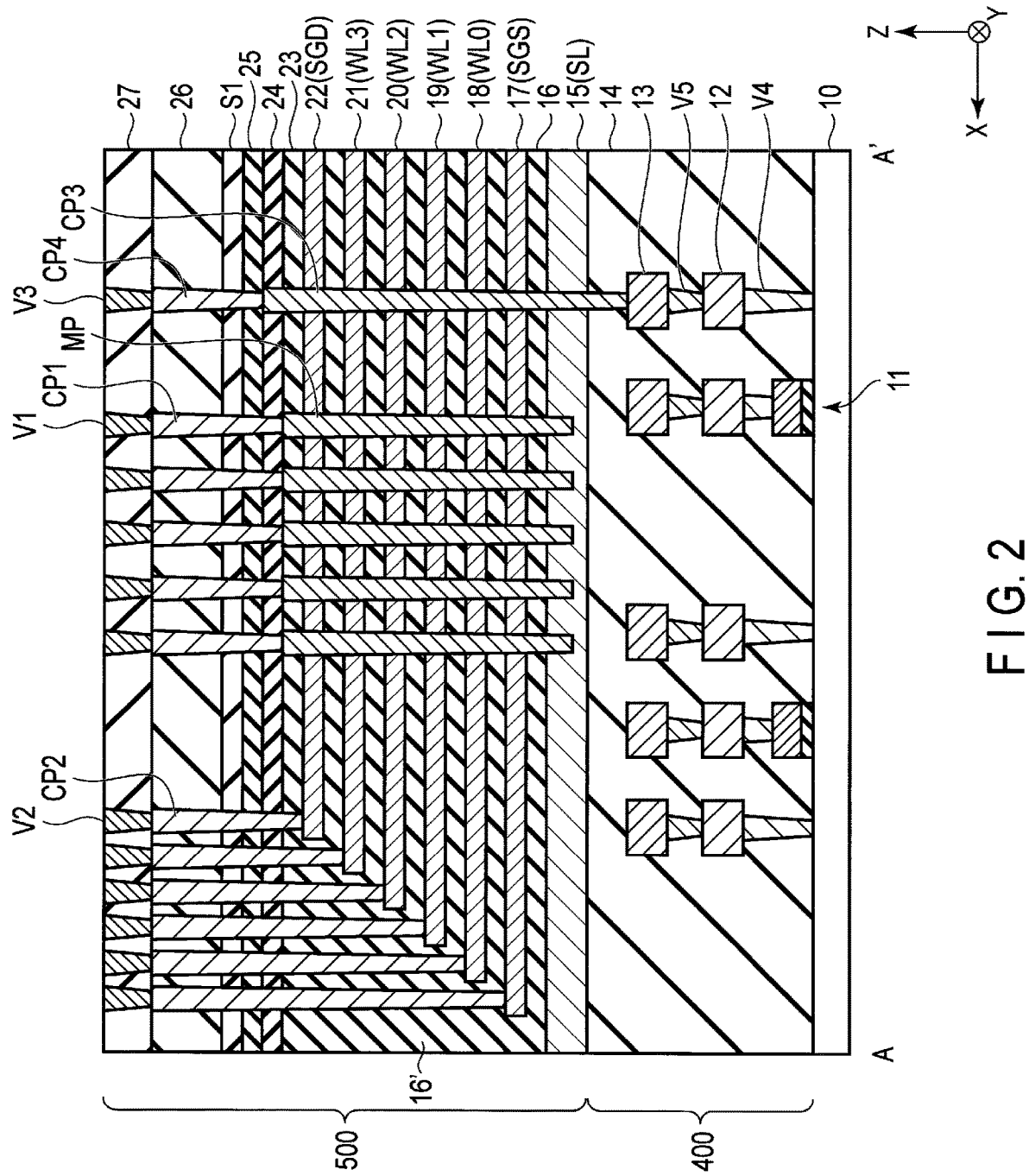
FIG. 2 is a cross section of the structure of FIG. 1, taken along line A-A'.
Figure 3:
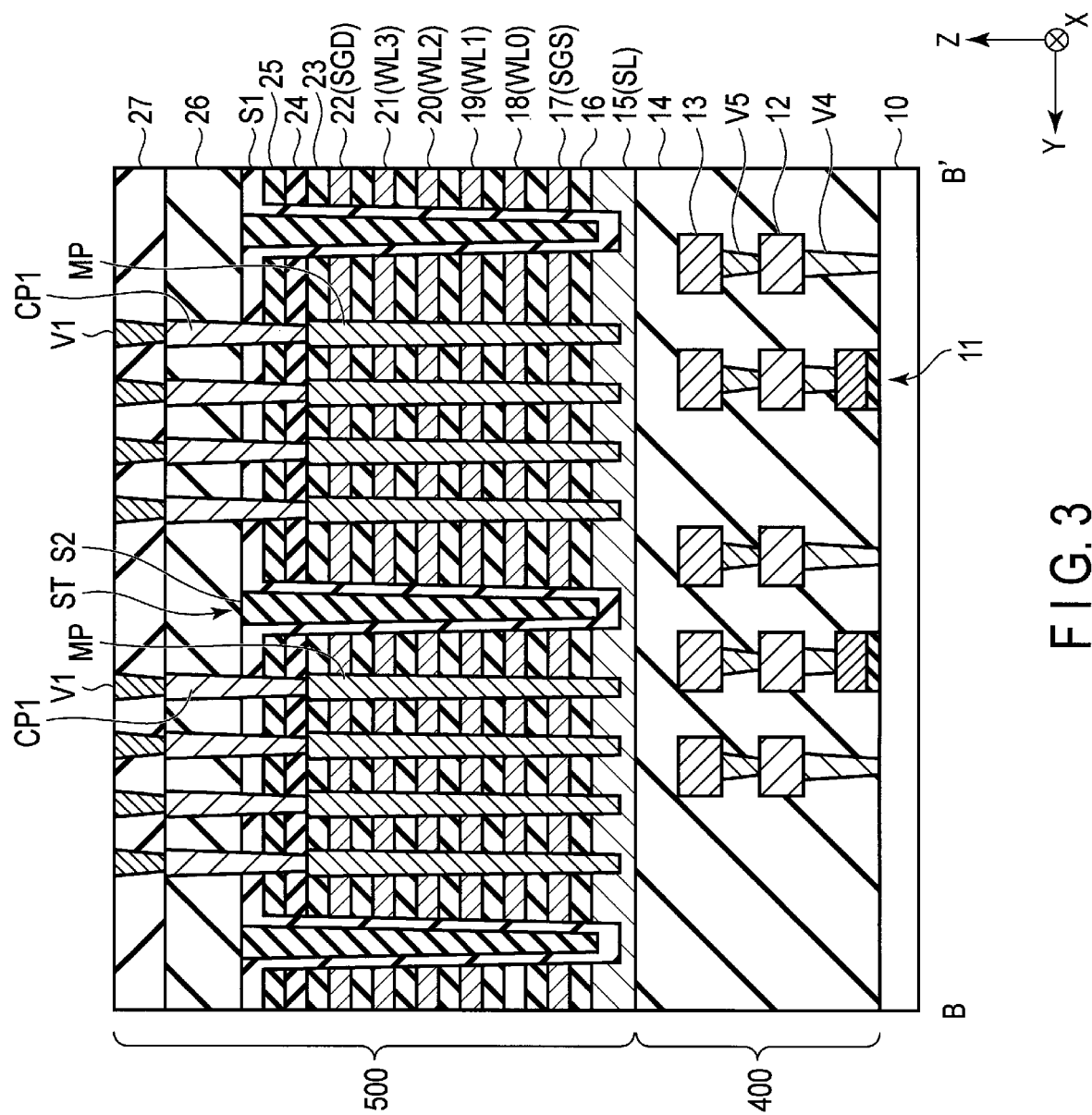
FIG. 3 is a cross section of the structure of FIG. 1, taken along line B-B'.

FIG. 1 is a plan view showing the structure of the semiconductor memory device according to the first embodiment. FIG. 2 is a cross section of the structure of FIG. 1, taken along line A-A', and FIG. 3 is a cross section of the structure of FIG. 1, taken along line B-B'. In FIG. 1, two directions that are orthogonal to each other and are both parallel to the surface of the semiconductor substrate are referred to as X and Y directions, and the direction orthogonal to these X and Y directions (X-Y surface) is referred to as the Z direction. Bit lines are omitted from FIGS. 1 to 3.

The semiconductor memory device includes a memory cell array region 100, a hookup region 200, and a contact region 300, as illustrated in FIG. 1.

The memory cell array region 100 includes a plurality of memory blocks 101. The memory blocks 101 each extend in the X direction, and are aligned in the Y direction. Each of the memory blocks 101 has the same structure.

Each of the memory blocks 101 has a plurality of memory pillars MP. The memory pillars MP are arranged in a matrix, or in other words, aligned in the X and Y directions. The number of memory pillars MP may be determined as needed. Each of the memory pillars MP is coupled to a via V1 as illustrated in FIGS. 2 and 3, with a contact CP1 interposed therebetween.

Slits (isolation regions) ST are provided between the memory blocks 101 to extend in the X direction. The slits ST include insulation layers S1 and S2. A slit ST isolates the memory blocks 101 into the respective the memory blocks 101. The number of slits ST may be determined as needed.

The hookup region 200 includes a plurality of contacts CP2 coupled to word lines, which will be described later. The contacts CP2 are arranged in the X direction. The contacts CP2 are coupled to the vias V2, as illustrated in FIG. 2.

The contact region 300 includes a plurality of through contacts CP3 coupled to a peripheral circuit, which will be discussed later. The through contacts CP3 are coupled to the vias V3 with contacts CP4 interposed therebetween, as illustrated in FIG. 2.

As illustrated in FIGS. 2 and 3, a peripheral circuit region 400 and a memory circuit region 500 are provided on the semiconductor substrate, for example on a silicon substrate 10. The peripheral circuit region 400 includes the peripheral circuit for controlling writing, reading, and erasing of data with respect to each memory cell. The peripheral circuit includes a CMOS circuit 11 having re-channel MOS transistors (hereinafter, nMOS transistors) and p-channel MOS transistors (hereinafter, pMOS transistors). The memory circuit region 500 includes the aforementioned memory pillars MP, a plurality of word lines WL0 to WL3, a source-side select gate line SGS, a drain-side select gate line SGD, a source line SL, and bit lines BL, which is not shown. Hereinafter, the "word line WL" denote "each of word lines WL0 to WL3". The number of word lines WL may be determined as needed.

The sectional structure of the semiconductor memory device taken along line A-A' is explained below by referring to FIG. 2. The CMOS circuit 11 including, for example, the nMOS transistors and the pMOS transistors, and vias V4 may be provided on the silicon substrate 10. The vias V4 are coupled to the source, drain, or gate of the nMOS transistor and the pMOS transistor.

A conductive layer (e.g., interconnect or pad) 12 is provided on each via V4. A via V5 is provided on the conductive layer 12. A conductive layer (e.g., interconnect or pad) 13 is provided on the via V5. An insulation layer 14 is provided around the CMOS circuit 11, conductive layers 12 and 13, and vias V4 and V5 on the silicon substrate 10.

A conductive layer 15 is provided on the insulation layer 14. The conductive layer 15 functions as a source line SL. A plurality of insulation layers 16 and a plurality of conductive layers 17 to 22 are alternately stacked on the conductive layer 15 to form a stacked body. The conductive layers 17 to 22 extend in the X direction. The conductive layer 17 functions as a source-side select gate line SGS, the conductive layers 18 to 21 function as the word lines WL0 to WL3, respectively, and the conductive layer 22 functions as a drain-side select gate line SGD.

An insulation layer 23 is provided on the conductive layer 22. Memory pillars MP are provided to extend in the Z direction in the insulation layers 16, the conductive layers 17 to 22, and the insulation layer 23. One end of each memory pillar MP is coupled to the conductive layer (source line SL) 15, and the other end of the memory pillar MP reaches the upper surface of the insulation layer 23. That is, the memory pillars MP extend from the source line SL through the insulation layers 16, the source-side select gate line SGS, the word lines WL0 to WL3, the drain-side select gate line SGD, and the insulation layer 23 to reach the upper surface of the insulation layer 23. The memory pillars MP will be discussed in more detail later.

Insulation layers 24, 25, S1, and 26 are provided in this order on the memory pillars MP and the insulation layer 23. The contacts CP1 are provided to extend in the Z direction in the insulation layers 24, 25, S1, and 26 of the memory cell array region 100. Each of the contacts CP1 extends from the upper surface of the insulation layer 26 to the corresponding memory pillar MP, and is coupled to the memory pillar MP.

In the hookup region 200, the conductive layers 17 to 22 are processed into a stair-like structure along the X direction. An insulation layer 16' is provided on the stair-like conductive layers 17 to 22 to fill in the steps formed by the stacked body of the conductive layers 17 to 22 that are stacked in the memory cell array region 100 so that the upper surfaces of the memory cell array region 100 and the hookup region 200 can be flattened with each other. In the hookup region 200, a plurality of contacts CP2 are provided to extend in the Z direction in the insulation layers 16', 23 to 25, S1, and 26. The contacts CP2 extend from the upper surface of the insulation layer 26 to a corresponding one of the conductive layers 17 to 22, and are coupled to a corresponding one of the source-side select gate line SGS, the word lines WL0 to WL3, and the drain-side select gate line SGD.

In the contact region 300, a through contact CP3 is provided to extend in the Z direction in the insulation layers 14, 16, 23, 24, and the conductive layers 15, 17 to 22. The through contact CP3 extends from the upper surface of the insulation layer 24 to the conductive layer 13, and is coupled to the conductive layer 13. The through contact CP3 will be discussed later in more detail.

A contact CP4 is provided to extend in the Z direction in the insulation layer 25, S1, and 26. The contact CP4 extends from the upper surface of the insulation layer 26 to the through contact CP3, and is coupled to the through contact CP3.

Furthermore, an insulation layer 27 is provided on the contacts CP1, CP2, CP4 and the insulation layer 26. In the memory cell array region 100, the vias V1 are provided to extend in the Z direction in the insulation layer 27. Each of the vias V1 extends from the upper surface of the insulation layer 27 to the corresponding one of the contacts CP1, and is coupled to the contact CP1. The vias V1 are coupled also to the bit line BL that is not shown.

In the hookup region 200, the vias V2 are provided to extend in the Z direction in the insulation layer 27. Each of the vias V2 extends from the upper surface of the insulation layer 27 to the contact CP2. The via V2 is coupled to the contact CP2.

In the contact region 300, the vias V3 are provided to extend in the Z direction in the insulation layer 27. Each of the vias V3 extends from the upper surface of the insulation layer 27 to the corresponding one of the contacts CP4, and is coupled to the contact CP4.

Next, the cross-sectional structure of the semiconductor memory device taken along line B-B' will be explained by referring to FIG. 3. The structures of the peripheral circuit region 400 and the memory blocks 101 including the memory pillars MP that have already been explained with reference to FIG. 2 are omitted from the explanation here.

As discussed above, a slit (isolation region) ST is provided between the memory blocks 101 to extend in the X direction. The slit ST isolates the memory blocks 101 from each other. In other words, the slit ST isolates, in the Y direction, the memory cell arrays having memory pillars MP, and also isolates the stacked bodies of the conductive layers 17 to 22.

The slit ST includes an insulation layer S1 and an insulation layer S2. The insulation layers S1 and S2 are provided in this order on the side walls of the insulation layers 16, 24, and 25, and of the conductive layers 17 to 22 between the memory blocks 101. The insulation layer S1 is also provided on the upper surface of the insulation layer 25.

[1-1-1] Structure of Memory Cell Array

Next, the structure of a memory cell array included in the semiconductor memory device according to the first embodiment will be explained with reference to FIG. 4 in detail. FIG. 4 is a cross section of a memory cell array, taken along the Y direction. The insulation layers are omitted in this drawing.

The memory cell array includes a plurality of NAND strings NS. One end of each NAND string NS is coupled to the conductive layer (source line SL) 15, while the other end of the NAND string NS is coupled to the contact CP1. The NAND string NS includes a selection transistor ST1, memory transistors MT0 to MT3, and a selection transistor ST2.

The conductive layer (source-side select gate line SGS) 17, the conductive layers (word lines WL0 to WL3) 18 to 21, and the conductive layer (drain-side select gate line SGD) 22 are stacked on the conductive layer 15 in such a manner as to be separated from each other, and memory pillars MP are provided on the conductive layer 15 in a manner as to penetrate the conductive layers 17 to 22. The NAND strings NS are provided at the intersecting portions of the conductive layers 17 to 22 and the memory pillars MP.

A memory pillar MP includes, for example, a cell insulation film 30, a semiconductor layer 31, and a core insulation layer 32. The cell insulation film 30 includes a block insulation film 30A, a charge storage film 30B, and a tunnel insulation film 30C. In particular, the block insulation film 30A is provided on the inner wall of a memory hole in which a memory pillar MP is to be formed. The charge storage film 30B is provided on the inner wall of the block insulation film 30A. The tunnel insulation film 30C is provided on the inner wall of the charge storage film 30B. The semiconductor layer 31 is provided on the inner wall of the tunnel insulation film 30C. Furthermore, the core insulation layer 32 is provided inside the semiconductor layer 31.

In the structure of a memory pillar MP, the intersecting portion of the memory pillar MP and the conductive layer 17 functions as a selection transistor ST2. The intersecting portions of the memory pillar MP and conductive layers 18 to 21 function as memory transistors MT0 to MT3, respectively. The intersecting portion of the memory pillar MP and the conductive layer 22 functions as the selection transistor ST1. Hereinafter, the "memory transistor MT" denote "each of memory transistors MT0 to MT3".

The semiconductor layer 31 functions as a channel layer for the memory transistors MT and the selection transistors ST1 and ST2.

The charge storage film 30B functions as a charge storage film of a memory transistor MT to accumulate the charge injected from the semiconductor layer 31. The charge storage film 30B includes, for example, a silicon nitride film.

The tunnel insulation film 30C functions as a potential barrier when the charge is injected from the semiconductor layer 31 into the charge storage film 30B, or when the charge accumulated in the charge storage film 30B is diffused into the semiconductor layer 31. The tunnel insulation film 30C includes, for example, a silicon oxide film.

The block insulation film 30A prevents the charge accumulated in the charge storage film 30B from diffusing into the conductive layers (word lines WL) 18 to 21. The block insulation film 30A includes, for example, a silicon oxide film and a silicon nitride film.

[1-1-2] Main Structure of First Embodiment

The main structure of the semiconductor memory device according to the first embodiment will be explained next, with reference to FIG. 5. FIG. 5 is a cross section of the main structure according to the first embodiment, taken along the Y direction. For the sake of simplicity, the slit ST, the memory pillars MP, and the through contact CP3 are illustrated as being aligned in this drawing.

The memory pillars MP are provided in the insulation layers 16, the conductive layers 17 to 22, and the insulation layer 23 on the conductive layer (source line SL) 15. Each of the memory pillars MP has a pillar structure (or columnar shape) extending in the Z direction that is orthogonal to the surface of the silicon substrate 10. The insulation layer 24 is provided above the memory pillars MP and on the insulation layer 23. The insulation layers 23 and 24 include, for example, a silicon oxide layer.

The through contact CP3 is provided in the conductive layer 15, the insulation layers 16, the conductive layers 17 to 22, and the insulation layers 23 and 24. That is, the through contact CP3 is provided to penetrate the conductive layer 15, the insulation layers 16, the conductive layers 17 to 22, and the insulation layers 23 and 24. The through contact CP3 includes an insulation layer CP3a and a conductive layer CP3b. The insulation layer CP3a includes, for example, a silicon oxide layer. The conductive layer CP3b includes, for example, tungsten. The insulation layer 25 is provided on the through contact CP3 and the insulation layer 24. The insulation layer 25 includes, for example, a silicon oxide layer.

As illustrated in FIG. 3, a slit (isolation region) ST is provided between the memory blocks 101. With reference to FIG. 5, the insulation layer S1 is provided on the side walls of the insulation layers 16, the conductive layers 17 to 22, and the insulation layers 23, 24, and 25. The insulation layer S1 is also provided on the insulation layer 25. In addition, the insulation layer S2 is provided on the side wall of the insulation layer S1 in the slit ST. The insulation layer S2 has a plate-like structure extending in the Z direction that is orthogonal to the surface of the silicon substrate 10. The insulation layer S1 includes, for example, a silicon nitride layer, silicon carbide (SiC) layer, or metal oxide layer (e.g., aluminum oxide layer and hafnium oxide layer). The insulation layer S2 includes, for example, a silicon oxide layer.

The insulation layer 26 is provided on the insulation layers S1 and S2. The contacts CP1 are provided on the memory pillars MP in the insulation layers 24, 25, S1, and 26. The contact CP4 is provided on the through contact CP3 in the insulation layers 25, S1, and 26. The insulation layer 26 includes, for example, a silicon oxide layer.

The insulation layer 27 is provided on the contacts CP1, the through contact CP3, and the insulation layer 26. The vias V1 are provided on the contact CP1 in the insulation layer 27. The via V3 is provided on the contact CP4 in the insulation layer 27. The insulation layer 27 includes, for example, a silicon oxide layer. The vias V1 and V3 includes, for example, tungsten.

[1-2] Manufacturing Method of Semiconductor Memory Device

Next, the manufacturing method of the semiconductor memory device according to the first embodiment will be explained with reference to FIGS. 6 to 12, and also FIG. 5. FIGS. 6 to 12 are cross sections of a structure, representing the processes of the method for manufacturing the semiconductor memory device according to the first embodiment.

As illustrated in FIG. 6, a plurality of insulation layers (silicon oxide layers) 16 and a plurality of insulation layers (silicon nitride layers) 28 are alternately stacked on the conductive layer 15. The insulation layer 23 is formed on the top insulation layer 28.

Next, a memory pillar MP is formed in the insulation layers 16, the insulation layers 28, and the insulation layer 23 on the conductive layer 15. Thereafter, the insulation layer 24 is formed by CVD on the memory pillar MP and the insulation layer 23. Then, a contact formation hole 29 is formed by RIE in the insulation layers 23 and 24, the insulation layers 16, the insulation layers 28, and the conductive layer 15.

As illustrated in FIG. 7, an insulation layer CP3a is formed by CVD on the side walls of the contact formation hole 29. Then, the insulation layer CP3a is removed by RIE from the bottom surface of the contact formation hole 29. Thereafter, a conductive layer CP3b is formed in the contact formation hole 29. In this manner, a through contact CP3 is formed in the contact formation hole 29. Furthermore, an insulation layer 25 is formed by CVD on the through contact CP3 and insulation layer 24.

As illustrated in FIG. 8, the stacked body of the insulation layers 23 to 25, the insulation layers (silicon oxide layers) 16, and the insulation layers (silicon nitride layers) 28 is etched by RIE to form a slit formation trench 40.

The insulation layers (silicon nitride layers) 28 are removed by wet etching using, for example, a phosphoric acid solution introduced from the slit formation trench 40. The insulation layers 16, 23 to 25, on the other hand, will remain without being removed. In this manner, gaps are formed between the insulation layers 16. These gaps between the insulation layers 16 are filled by CVD with a conductive material such as tungsten as illustrated in FIG. 9. As a result, the conductive layer (source-side select gate line SGS) 17, the conductive layers (word lines WL0 to WL3) 18 to 21, and the conductive layer (drain-side select gate line SGD) 22 are formed.

Figure 10:
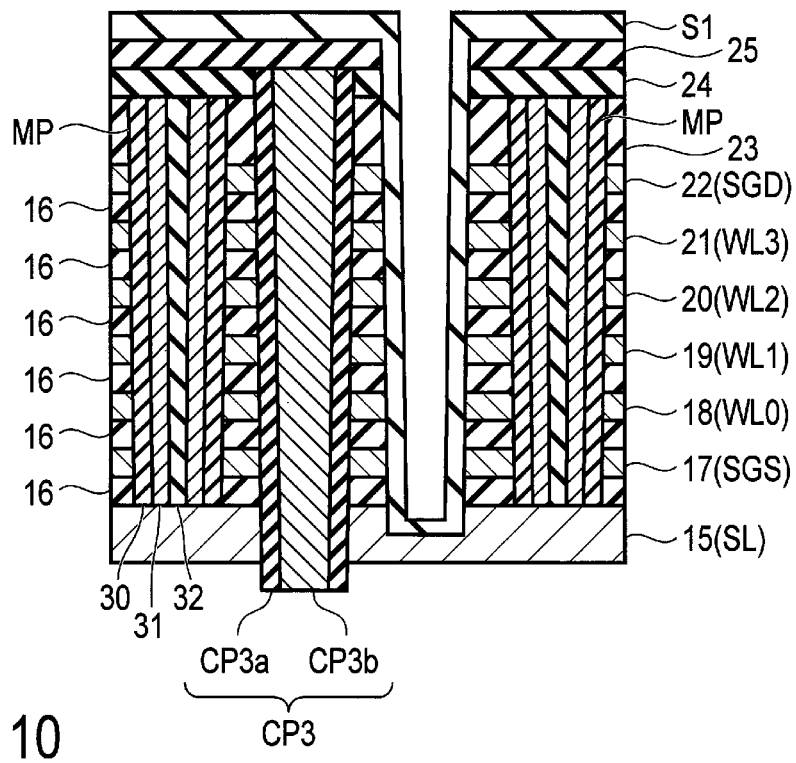
Figure 11:
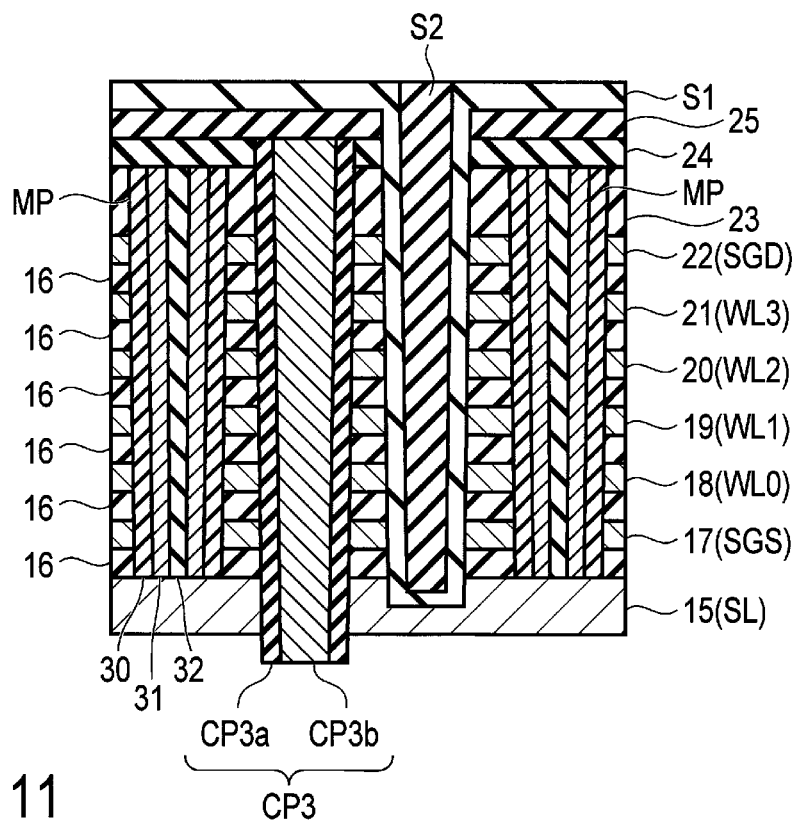

Next, as illustrated in FIG. 10, the insulation layer (silicon nitride layer) S1 is formed by CVD on the side walls of the slit formation trench 40 and on the upper surface of the insulation layer 25. In order to fill the slit formation trench 40 with the insulation layer (silicon oxide layer) S2, the insulation layer S2 is deposited by CVD on the insulation layer S1. As illustrated in FIG. 11, the insulation layer S2 over the slit formation trench 40 and on the insulation layer S1 is removed by etching back so that the surfaces of the slit ST and insulation layer S1 can be flattened with each other.

Figure 12:
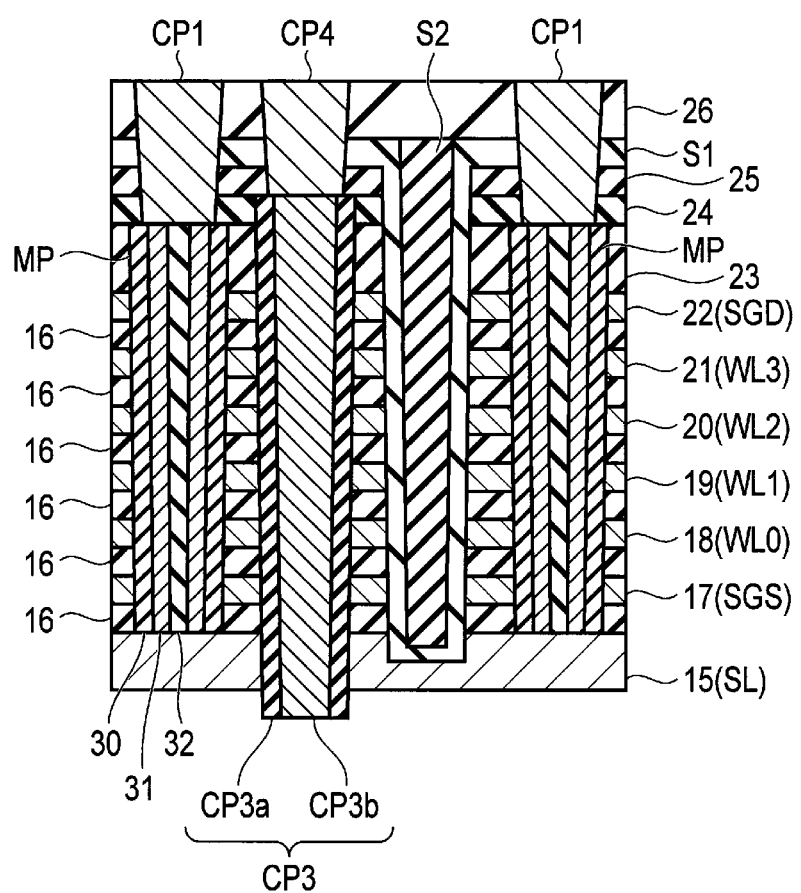

Next, the insulation layer 26 is formed by CVD on the insulation layers S1 and S2, as illustrated in FIG. 12. Thereafter, portions of the insulation layers 24, 25, S1, and 26 on the memory pillars MP are etched by RIE to form contact formation holes. The insulation layers 25, S1, and 26 on the through contact CP3 are also etched to form a contact formation hole. These contact formation holes are filled with tungsten by CVD. In this manner, the contacts CP1 are formed on the memory pillars MP, and the contact CP4 is formed on the through contact CP3.

Next, as illustrated in FIG. 5, the insulation layer 27 is formed by CVD on the contacts CP1, CP4, and the insulation layer 26. The portions of the insulation layer 27 on the contacts CP1 and CP4 are etched by RIE to form via formation holes, and the via formation holes are filled with tungsten by CVD. In this manner, vias V1 and V3 are formed on the contacts CP1 and CP4, respectively. Finally, bit lines and other interconnects, as well as insulation layers are formed so that the manufacturing process of the semiconductor memory device is completed.

[1-3] Effects of First Embodiment

According to the first embodiment, the insulation layer (e.g., silicon nitride layer) S1 is provided on the inner walls of the slit ST formation trench and on the upper surface of the insulation layer (e.g., silicon oxide layer) 25, as described above. Thus, when etching the insulation layer (e.g., silicon oxide layer) S2 on the insulation layer (silicon nitride layer) S1, the insulation layer (silicon oxide layer) 25 underneath the insulation layer (silicon nitride layer) S1 can be prevented from being etched. In this manner, the height from each memory pillar MP to the insulation layer (silicon nitride layer) S1 (i.e., the thickness of the silicon oxide layers) can be controlled to attain a predetermined length.

Specifically, during the process of filling the slit ST formation trench with an insulation layer (silicon oxide layer) S2, the insulation layer (silicon oxide layer) S2 is deposited on the insulation layer (silicon nitride layer) S1 on the insulation layer (silicon oxide layer) 25 as a result of the formation of the insulation layer (silicon oxide layer) S2 in the slit ST formation trench. When etching back the silicon oxide layer over the slit ST and on the insulation layer (silicon nitride layer) S1, the etching of the insulation layer (silicon oxide layer) S2 will be stopped at the insulation layer (silicon nitride layer) S1. That is, the insulation layer (silicon nitride layer) S1 will serve as an etching stopper, thus preventing the insulation layer 25 underneath the insulation layer (silicon nitride layer) S1 from being etched. In this manner, the insulation layers provided between the memory pillar MP and the insulation layer (silicon nitride layer) S1 can be controlled to have a predetermined thickness.

Thereafter, the hole for the contact CP1 that is to be coupled to the memory pillar MP is formed. At this point, because the insulation layers between the memory pillar MP and the insulation layer (silicon nitride layer) S1 have a predetermined thickness, there is no need to consider the processing variations when determining a depth of the contact CP1 formation hole to be etched. As a result, any defect that tends to occur during the formation of the contact CP1, such as a contact CP1 being wrongly coupled to the drain-side select gate line SGD, can be suppressed.

In addition, slits (isolation regions) ST are provided between the memory blocks 101 (or between memory cell arrays, or between memory pillars), and each slit ST isolates the memory blocks 101 from each other. The insulation layer (silicon nitride layer) S1 is formed on the side walls of the slit ST and on the upper surface of the insulation layer 25. In the subsequent heat treatment, hydrogen is diffused from this silicon nitride layer. The diffused hydrogen can effectively terminate the dangling bonds that exist in the channel of the memory transistors MT. Thus, by covering with the insulation layer (silicon nitride layer) S1 the memory blocks 101 in which the memory transistors MT are arranged, the cell current that appears in the memory transistors MT can be effectively dealt with.

As discussed above, the reliability of the semiconductor memory device can be improved according to the first embodiment.

[2] Second Embodiment

Next, a semiconductor memory device according to a second embodiment will be explained. In the second embodiment, the contacts CP1 and through contacts CP3 are formed in the same process after the formation of the memory pillars MP. The explanation of the second embodiment will focus mainly on the points that differ from the first embodiment.

[2-1] Structure of Semiconductor Memory Device

Figure 13:
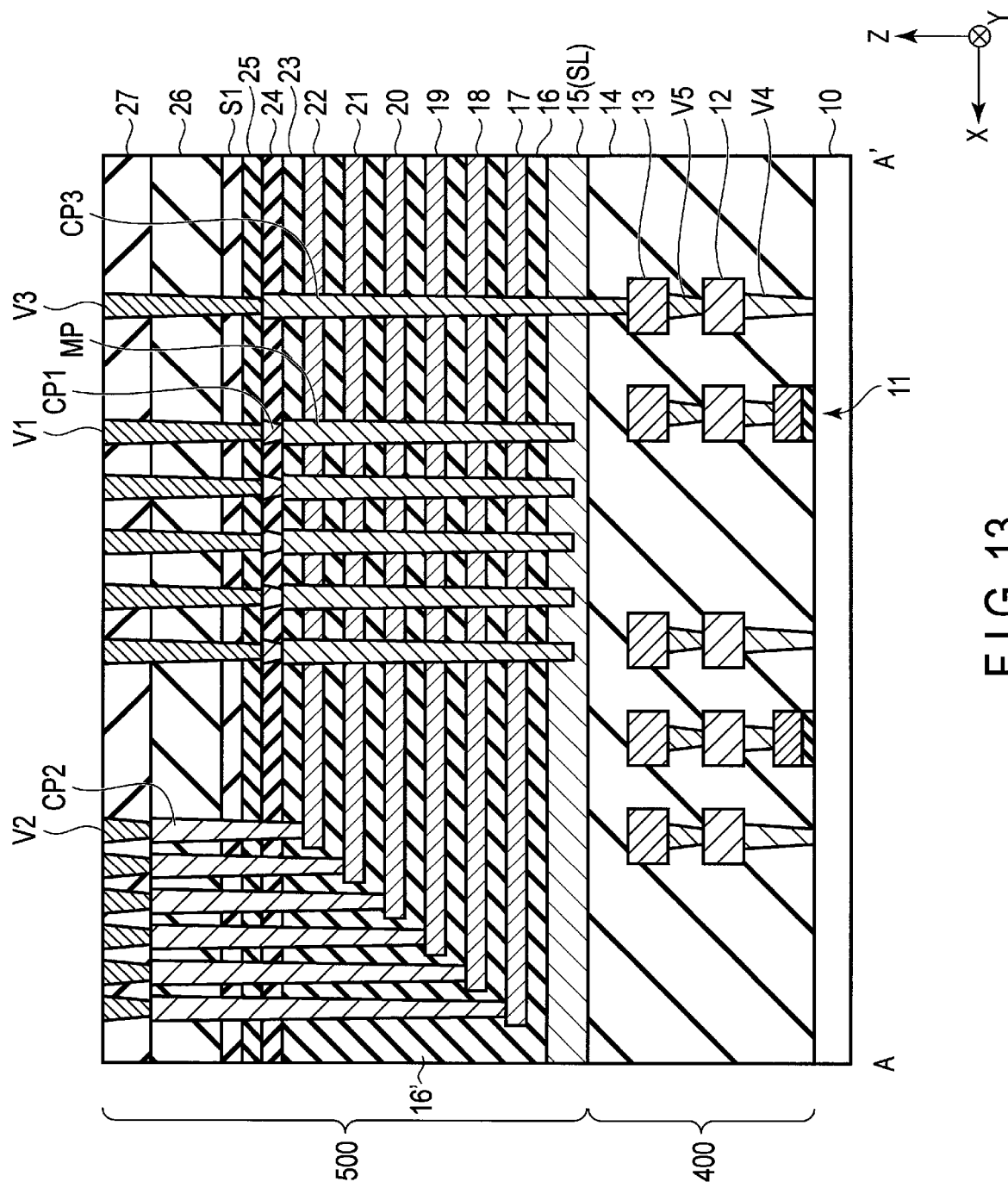
FIG. 13 is a cross section of a semiconductor memory device according to a second embodiment, taken along line A-A' of FIG. 1.
Figure 14:
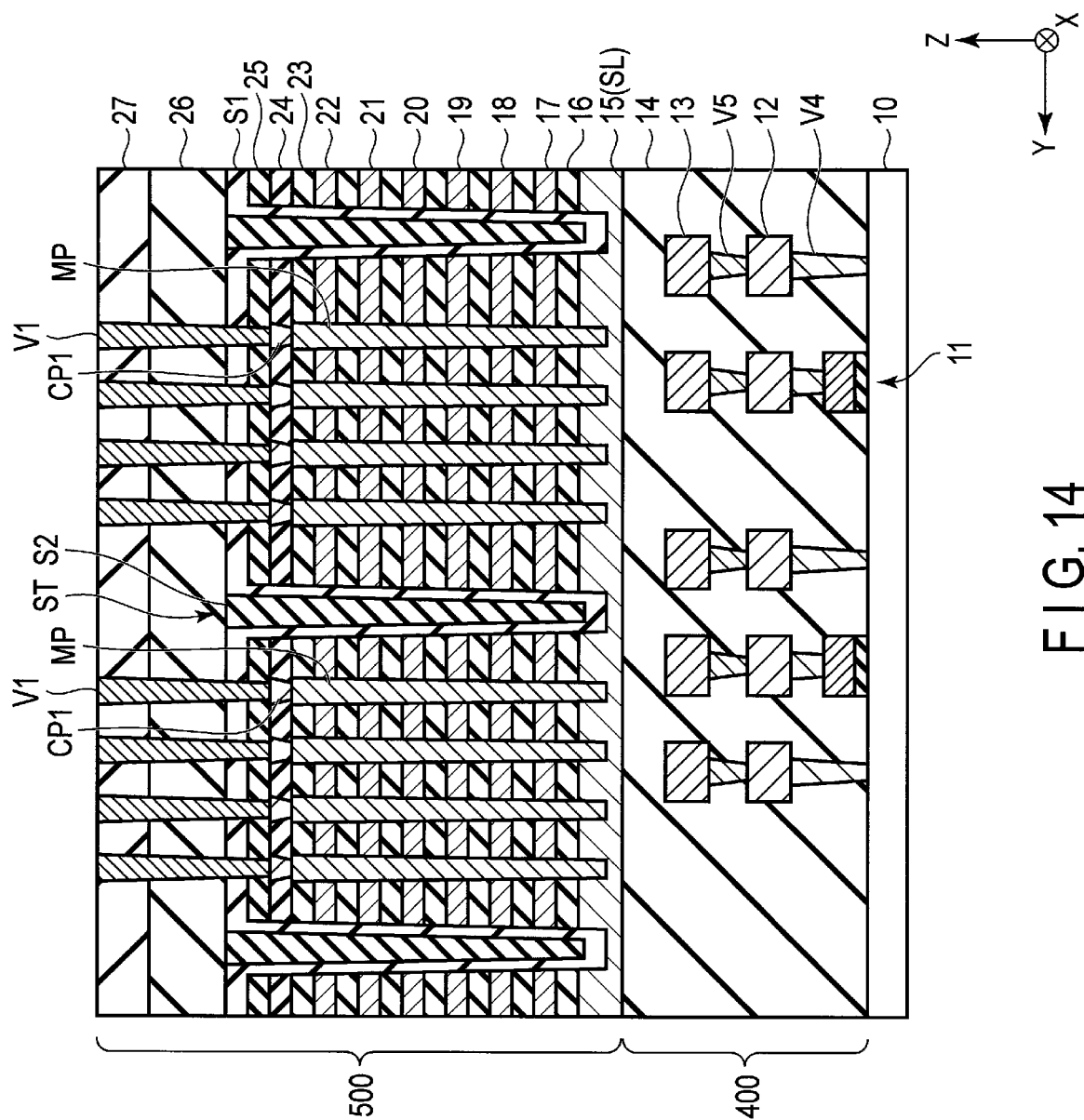
FIG. 14 is a cross section of the semiconductor memory device according to the second embodiment, taken along line B-B' of FIG. 1.

The plan view of the semiconductor memory device according to the second embodiment is the same as FIG. 1. FIG. 13 is a cross section of the structure according to the second embodiment, taken along line A-A' of FIG. 1. FIG. 14 is a cross section of the structure, taken along line B-B' of FIG. 1.

As illustrated in FIGS. 13 and 14, contacts CP1 are provided on the memory pillars MP in the insulation layer 24. Furthermore, vias V1 are provided on the contacts CP1 in the insulation layers 25, S1, 26, and 27. The memory pillars MP are thereby coupled to the vias V1 with the contacts CP1 interposed therebetween. The via V3 is provided on the through contact CP3 in the insulation layers 25, S1, 26, and 27. The through contact CP3 is coupled to the via V3.

[2-1-1] Main Structure of Second Embodiment

Figure 15:
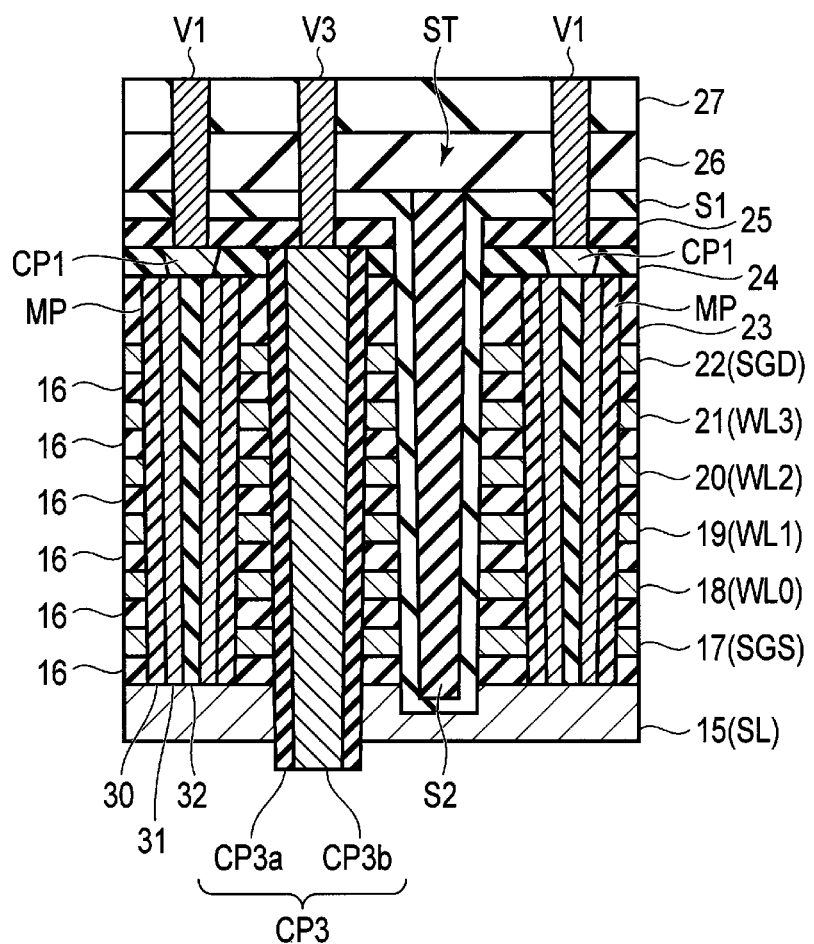
FIG. 15 is a cross section of the main portion of the structure according to the second embodiment.

The main structure of the semiconductor memory device according to the second embodiment will be explained with reference to FIG. 15. FIG. 15 is a cross section of the main structure according to the second embodiment, taken along the Y direction. For the sake of simplicity, the slit ST, memory pillars MP, and through contact CP3 are illustrated as being aligned in this drawing.

The memory pillars MP are provided in the plurality of insulation layers 16, the conductive layers 17 to 22, and the insulation layer 23 on the conductive layer (source line SL) 15. The insulation layer 24 is provided above the memory pillars MP and on insulation layer 23. The contacts CP1 are provided on the memory pillars MP in the insulation layer 24.

The through contact CP3 is provided in the conductive layer 15, the insulation layers 16, the conductive layers 17 to 22, and the insulation layers 23 and 24. That is, the through contact CP3 is formed to penetrate the conductive layer 15, the insulation layers 16, the conductive layers 17 to 22, and the insulation layers 23 and 24. The insulation layer 25 is provided on the contacts CP1, the through contact CP3, and the insulation layer 24.

As illustrated in FIG. 14, slits ST are provided between the memory blocks 101. With reference to FIG. 15, the insulation layer S1 is provided on the side walls of the insulation layers 16, the conductive layers 17 to 22, and the insulation layers 23, 24, and 25. The insulation layer S1 is also provided on the insulation layer 25. Furthermore, the insulation layer S2 is formed on the side walls of the insulation layer S1 in the slit ST. The insulation layer S1 includes, for example, a silicon nitride layer, a silicon carbide (SiC) layer, or a metal oxide layer (e.g., aluminum oxide layer and hafnium oxide layer). The insulation layer S2 includes, for example, a silicon oxide layer.

The insulation layers 26 and 27 are formed in this order on the insulation layers S1 and S2. The vias V1 are provided on the contact CP1 in the insulation layers 25, S1, 26, and 27. The via V3 is provided on the through contact CP3 in the insulation layers 25, S1, 26, and 27.

[2-2] Manufacturing Method of Semiconductor Memory Device

Next, the manufacturing method of the semiconductor memory device according to the second embodiment will be explained with reference to FIGS. 16 to 22, and also FIG. 15. FIGS. 16 to 22 are cross sections of a structure, which represent processes of the method for manufacturing the semiconductor memory device according to the second embodiment.

First, memory pillars MP are formed on the conductive layer 15 in the insulation layers 16, the insulation layers 28, and the insulation layer 23, as illustrated in FIG. 16. Thereafter, the insulation layer 24 is formed by CVD on the memory pillar MP and insulation layer 23, and then a contact formation hole 29 is formed by RIE in the insulation layers 23 and 24, the insulation layers 16, the insulation layers 28, and the conductive layer 15. An insulation layer CP3a is formed by CVD on the side walls of the contact formation hole 29 and on the upper surface of the insulation layer 24. The insulation layer CP3a includes, for example, a silicon oxide layer.

Next, contact formation holes are formed by RIE in the insulation layer 24 and the insulation layer CP3a on the memory pillars MP, and the insulation layer CP3a on the bottom of the contact formation hole 29 and on the insulation layer 24 are removed. Next, the conductive layer CP3b is formed in the contact formation holes on the memory pillars MP and also in the contact formation hole 29, as illustrated in FIG. 17. The conductive layer CP3b includes, for example, tungsten. In this manner, the contacts CP1 and the through contact CP3 are formed.

Next, the insulation layer 25 is formed by CVD on the contacts CP1, the through contact CP3 and the insulation layer 24, as illustrated in FIG. 18.

Thereafter, the stacked body including the insulation layers 23 to 25, the insulation layers (silicon oxide layers) 16 and the insulation layers (silicon nitride layers) 28 is etched by RIE to prepare a slit formation trench 40, as illustrated in FIG. 19.

Thereafter, the insulation layers (silicon nitride layers) 28 are removed by wet etching using, for example, a phosphoric acid solution introduced from the slit formation trench 40. On the other hand, the insulation layers 16, 23 to 25 remain, without being removed, as a result of which gaps are formed between the insulation layers 16. These gaps between the insulation layers 16 are filled by CVD with a conductive material such as tungsten as illustrated in FIG. 20. As a result, the conductive layer (source-side select gate line SGS) 17, the conductive layers (word lines WL0 to WL3) 18 to 21, and the conductive layer (drain-side select gate line SGD) 22 are formed.

Figure 22:
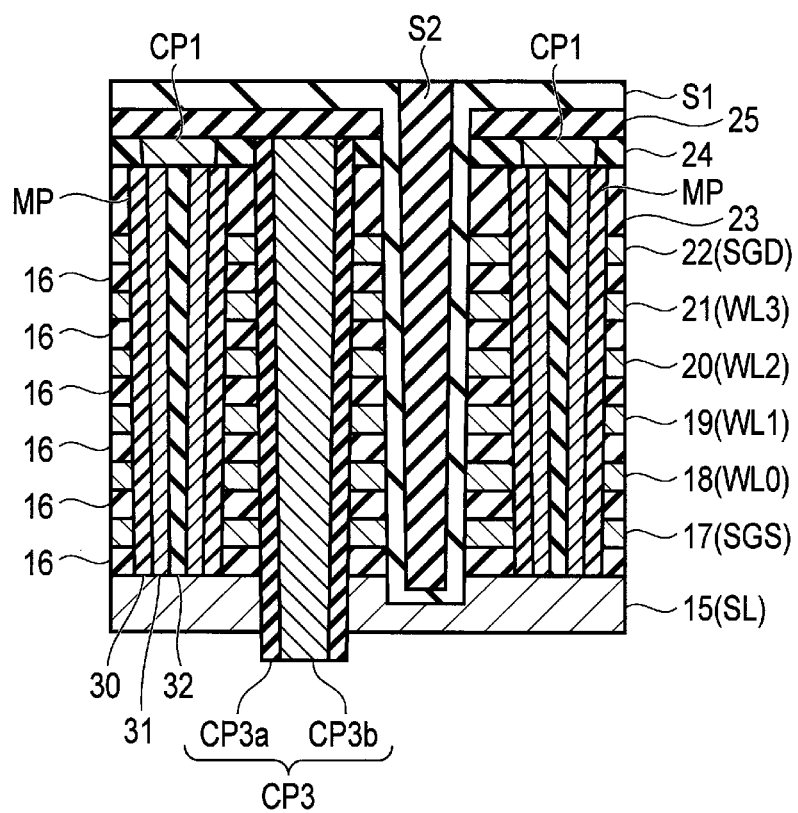

Next, as illustrated in FIG. 21, the insulation layer (silicon nitride layer) S1 is formed by CVD on the side walls of the slit formation trench 40 and on the upper surface of the insulation layer 25. In order to fill the slit formation trench 40 with the insulation layer (silicon oxide layer) S2, the insulation layer S2 is deposited by CVD on the insulation layer S1. As illustrated in FIG. 22, portions of the insulation layer S2 over the slit formation trench 40 and on the insulation layer S1 are removed by etching back so that the surfaces of the slit ST and the insulation layer S1 can be flattened with each other.

Next, the insulation layers 26 and 27 are formed by CVD on the insulation layers S1 and S2, as illustrated in FIG. 15. Thereafter, portions of the insulation layers 25, S1, 26, and 27 on the contact CP1 are etched by RIE to form holes for via formation. Portions of the insulation layers 25, S1, 26, and 27 on the through contact CP3 are also etched to form the via formation holes. The via formation holes are filled with tungsten by CVD. In this manner, the vias V1 are formed on the contact CP1, and the via V3 is formed on the through contact CP3. Thereafter, bit lines, other interconnects, and insulation layers are formed, and the manufacturing process of the semiconductor memory device is completed.

[2-3] Effects of Second Embodiment

According to the second embodiment, the reliability of the semiconductor memory device can be enhanced as in the above first embodiment.

In addition, according to the second embodiment, the contact CP1 and the through contact CP3 can be prepared in the same process. The number of processes therefore can be reduced in comparison with the first embodiment. Other effects are the same as in the first embodiment.

[3] Other Modification Examples

In the above embodiments, "coupling" indicates not only components being directly coupled to each other, but also components being coupled to each other with another component interposed therebetween.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the invention.

What is claimed is:

1. A semiconductor memory device comprising:
   a stacked body provided above a substrate, in which conductive layers are isolated from each other and stacked along a first direction crossing a surface of the substrate;
   a source layer provided between the substrate and the stacked body;
   memory pillars passing through the stacked body along the first direction and being coupled to the source layer;
   a first insulation film provided above the stacked body, the first insulation film being located higher than upper surfaces of the memory pillars in the first direction;
   isolation portions passing through the stacked body and the first insulation film along the first direction, extending in a second direction crossing the first direction and isolating the stacked body in a third direction crossing the first direction and the second direction;
   a first member including silicon and nitrogen provided above the first insulation film;
   a second member including silicon and nitrogen provided on side walls of the isolation portions;
   four conductive members aligning along the third direction between two isolation portions adjacent in the third direction of the isolation portions and each penetrating the first insulation film and the stacked body along the first direction within a region between the two isolation portions; and
   lower interconnects provided between the substrate and the source layer,
   the four conductive members including a first conductor and a second conductor each functioning as a through contact electrically connected to a corresponding lower interconnect of the lower interconnects while being electrically insulated from the source layer, the first conductor and the second conductor being two conductive members of the four conductive members adjacent in the third direction and a portion of the stacked body within the region between the two isolation portions being provided between the first and second conductors.

2. The semiconductor memory device according to claim 1,
   wherein each of the memory pillars has a columnar shape extending in the first direction, each of the isolation portions has a plate shape extending in the first direction, and the second member is arranged between the memory pillars and a first isolation portion of the two isolation portions and between the memory pillars and a second isolation portion of the two isolation portions.

3. The semiconductor memory device according to claim 1,
   wherein the first insulation film and the isolation portions include silicon oxide.

4. The semiconductor memory device according to claim 1,
   wherein intersections of the memory pillars and the conductive layers respectively function as memory cells.

5. The semiconductor memory device according to claim 1,
   wherein each of the memory pillars includes a charge storage film, a tunnel insulation film and a semiconductor layer.

6. The semiconductor memory device according to claim 1,
   further comprising a contact provided on a first memory pillar of the memory pillars, the contact extending along the first direction in the first insulation film.

7. The semiconductor memory device according to claim 6,
   wherein an upper surface of the contact is located higher than upper surfaces of the four conductive members in the first direction.

8. The semiconductor memory device according to claim 6,
   wherein the contact is coupled to a bit line through a via provided on the contact.

9. The semiconductor memory device according to claim 6,
   wherein the contact includes tungsten.

10. The semiconductor memory device according to claim 1,
    further comprising a first via provided on the first conductor and a second via provided on the second conductor, the first and second vias penetrating the first member along the first direction.

11. The semiconductor memory device according to claim 10,
    wherein the first and second vias include tungsten.

12. The semiconductor memory device according to claim 1,
    wherein a contact or a via is provided on one of the memory pillars and one of the first and second conductors respectively, neither any contact nor any via being provided on both of the two isolation portions adjacent in the third direction.

13. The semiconductor memory device according to claim 12,
    wherein the contact or the via includes tungsten.

14. The semiconductor memory device according to claim 1,
    wherein the four conductive members include tungsten.

15. The semiconductor memory device according to claim 1,
    wherein the four conductive members are provided in four holes formed through the stacked body along the first direction respectively, a second insulation film being provided on a side wall of each of the four holes.

16. The semiconductor memory device according to claim 15, wherein the second insulation film is in contact with the portion of the stacked body and electrically insulates between the first and second conductors and the conductive layers in the stacked body.

17. The semiconductor memory device according to claim 15, wherein the second insulation film includes silicon oxide.

18. The semiconductor memory device according to claim 15, wherein lower ends of the four conductive members and the second insulation film terminate at a substantially same height.

19. The semiconductor memory device according to claim 1, wherein the four conductive members are provided in respective positions of the stacked body not isolated from each other.

20. The semiconductor memory device according to claim 1, further comprising a peripheral circuit provided below the lower interconnects, the first and second conductors being coupled to the peripheral circuit.

* * * * *